United States Patent [19]
Stroud et al.

[11] Patent Number: 6,003,150
[45] Date of Patent: Dec. 14, 1999

[54] METHOD FOR TESTING FIELD PROGRAMMABLE GATE ARRAYS

[75] Inventors: Charles E. Stroud, Lexington, Ky.; Miron Abramovici, Murray Hill, N.J.

[73] Assignees: Lucent Technologies Inc., Murray Hill, N.J.; University of Kentucky Research Foundation, Lexington, Ky.

[21] Appl. No.: 08/974,799

[22] Filed: Nov. 20, 1997

Related U.S. Application Data

[63] Continuation of application No. 08/595,729, Feb. 2, 1996, abandoned.

[51] Int. Cl.⁶ .................................................... G06F 11/00
[52] U.S. Cl. ................................. 714/725; 395/500.17
[58] Field of Search .................... 371/22.2, 22.33, 371/22.35, 22.4, 22.5, 22.6, 25.1, 27.2; 395/183.06, 183.07, 183.13, 500.05, 500.17, 500.18; 364/488, 489, 580; 324/765; 714/725, 727, 733, 735, 30, 27; 365/201

[56] References Cited

U.S. PATENT DOCUMENTS

| | | | |
|---|---|---|---|
| Re. 34,445 | 11/1993 | Hayes et al. | 371/21.1 |
| 4,414,669 | 11/1983 | Heckelman et al. | 371/49 |
| 4,757,503 | 7/1988 | Hayes et al. | 371/21 |
| 4,817,093 | 3/1989 | Jacobs et al. | 371/25 |
| 5,051,996 | 9/1991 | Bergeson et al. | 371/22.4 |
| 5,081,297 | 1/1992 | Lebel et al. | 395/325 |
| 5,090,015 | 2/1992 | Dabbish et al. | 371/22.5 |
| 5,107,208 | 4/1992 | Lee | 324/158 R |
| 5,179,561 | 1/1993 | Izawa et al. | 371/52 |
| 5,260,946 | 11/1993 | Nunally | 371/22.1 |
| 5,278,841 | 1/1994 | Myers | 371/20.6 |
| 5,347,519 | 9/1994 | Cooke et al. | 371/22.2 |
| 5,361,264 | 11/1994 | Lewis | 371/22.5 |
| 5,430,734 | 7/1995 | Gilson | 371/22.2 |
| 5,475,624 | 12/1995 | West | 364/578 |
| 5,488,612 | 1/1996 | Heybruck | 371/22.2 |
| 5,508,636 | 4/1996 | Mange et al. | 326/38 |

*Primary Examiner*—Robert W. Beausoliel, Jr.
*Assistant Examiner*—Nadeem Iqbal
*Attorney, Agent, or Firm*—King and Schickli

[57] ABSTRACT

A method of testing field programmable gate arrays (FPGAs) includes the step of configuring programmable logic blocks of the FPGAs for completing a built-in self-test. This is followed by the steps of initiating the built-in self-test, generating test patterns with the programmable logic blocks and analyzing a resulting response to produce a pass/fail indication with the programmable logic blocks. More specifically, the configuring step includes establishing a first group of programmable logic blocks as test pattern generators and output response analyzers and a second group of programmable logic blocks as blocks under test. The blocks under test are then repeatedly reconfigured in order to completely test each block under test in all possible modes of operation. The programming of the first and second groups of programmable logic blocks is then reversed and the testing of each new block under test is then completed.

15 Claims, 1 Drawing Sheet

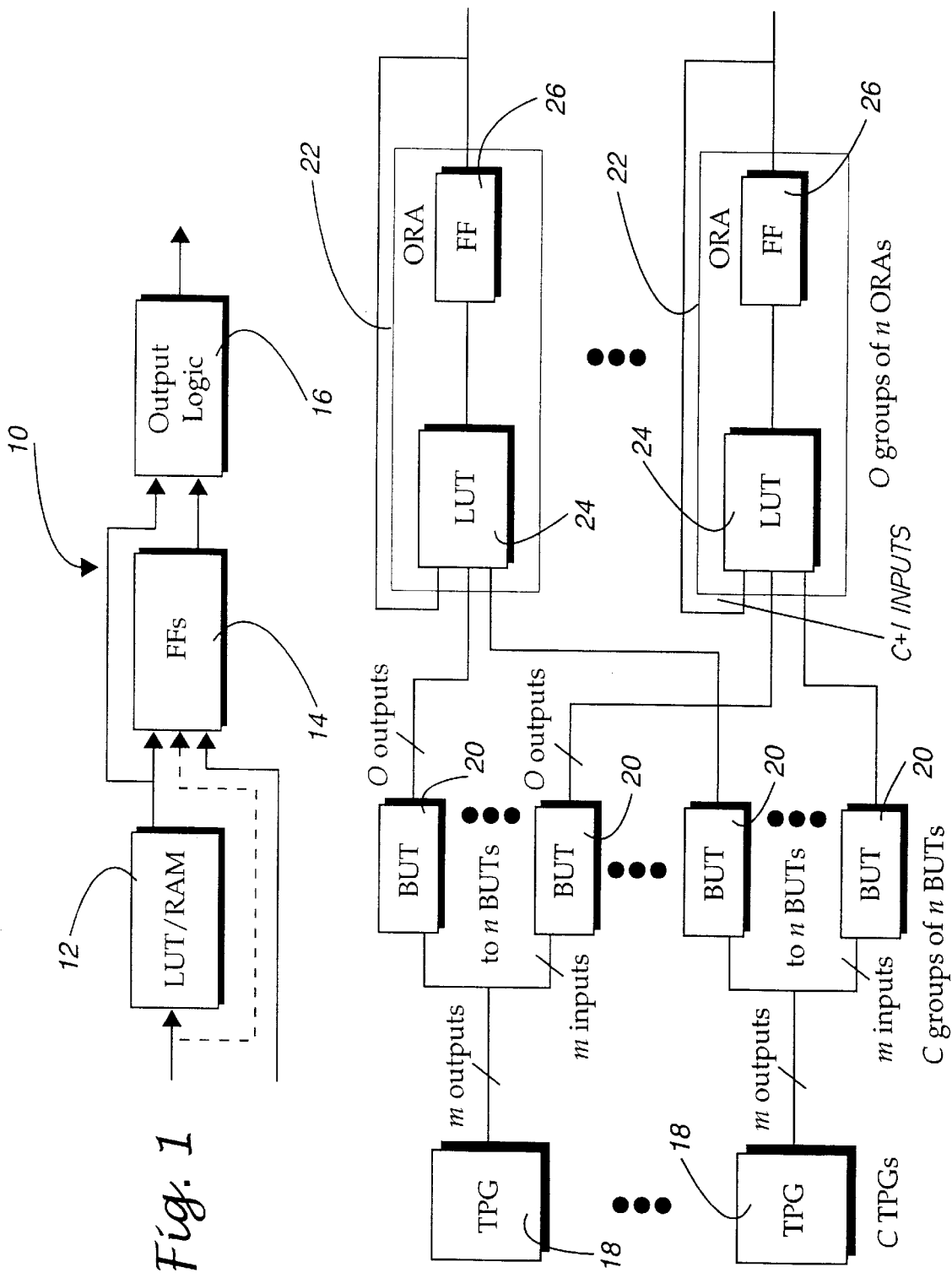

METHOD FOR TESTING FIELD PROGRAMMABLE GATE ARRAYS

This is a continuation of application Ser. No. 08/595,729, filed Feb. 2, 1996, now abandoned.

TECHNICAL FIELD

The present invention relates generally to the field of testing of integrated circuit devices and, more particularly, to a method of diagnostic testing applicable to field programmable gate arrays.

BACKGROUND OF THE INVENTION

A field programmable gate array (FPGA) is a type of integrated circuit consisting of an array of programmable logic blocks interconnected by programmable routing resources and programmable I/O cells. Programming of these logic blocks, routing resources and I/O cells is selectively completed to make the necessary interconnections that establish a configuration thereof to provide desired system operation/function for a particular circuit application.

Of course, it is desirable to complete diagnostic testing of all types of integrated circuits including FPGAs in order to check the functionality of the various programmable logic blocks, routing resources and I/O cells of the FPGAs. Since FPGAs are programmable, however, the diagnostic testing thereof is complicated by the need to cover all possible modes of operation and even many non-classical fault models (faults effecting the programmable interconnect network, delay faults, etc.).

In past diagnostic testing approaches, special test transistors and circuits have been added to each FPGA integrated circuit. These additional test transistors and circuits increase the complexity and space requirements or "area overhead" of the FPGAs. In fact, the size of the FPGAs is typically increased between 10–30% in order to accommodate the built-in test circuitry and significant delay penalties in the operating speed of the FPGAs result.

It should further be noted that in current state of the art testing procedures, tests are generated manually by configuring the FPGAs into several application circuits. The FPGAs so configured are then exercised with test vectors developed specifically for each application circuit. Since these circuits all share the same set of faults, FPGAs are rejected even if a fault is detected in only one of their circuits.

While this is an effective testing procedure, it does suffer from a number of drawbacks. For example, since all the application circuits must be simulated to complete testing for stuck-at faults, fault simulation in accordance with this procedure is very expensive. Additionally, the tests require a significant amount of time to complete and relatively sophisticated and expensive automatic test equipment (ATE) must be utilized.

Further, it should be appreciated that the FPGA manufacturing tests presently utilized are not reusable for board and system-level testing. Hence, additional developmental effort is required in order to complete a testing procedure at the system-level. The state of the art approach to system-level testing of FPGAs focuses upon the development of off-line system diagnostic routines to test the FPGAs in the system mode of operation. The development of these routines is costly and time consuming. This, of course, is another significant drawback to state of the art FPGA diagnostic testing.

A need is therefore identified for an improved approach for completing diagnostic testing of FPGAs.

SUMMARY OF THE INVENTION

Accordingly, it is a primary object of the present invention to provide a method of testing FPGAs overcoming the above-described limitations and disadvantages of the prior art.

Another object of the present invention is to provide a method of testing FPGAs that exploits the reprogrammability of the FPGAs to create built-in self-test (BIST) logic advantageously allowing off-line testing at both the manufacturing and system levels.

Yet another object of the present invention is to provide a simple and improved method of testing FPGAs wherein the FPGAs are temporarily programmed for built-in self-testing and the need to provide separate test circuitry on the FPGA is eliminated. Advantageously, this reduces area overhead allowing the use of smaller FPGAs with substantially faster system operating times for a given system function.

Yet another object of the present invention is to provide a BIST approach for testing FPGAs allowing both manufacturing and field level testing of digital systems that is particularly advantageous; providing high fault coverage testing at the system operating frequency. Accordingly, diagnostic run time is reduced and diagnostic software development is simplified. The reduction in the diagnostic run time advantageously results in the reduction in the mean time necessary to repair the system being tested. This effectively functions to increase system availability and, therefore, overall system productivity. Of course, the reductions in the time necessary to develop the diagnostic code also advantageously result in reduced development cost and system overhead.

Additional objects, advantages and other novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the foregoing and other objects, and in accordance with the purposes of the present invention as described herein, a new and improved method is provided for testing FPGAs. The method may be broadly defined as including the steps of configuring the programmable logic blocks of an FPGA for completing a built-in self-test, initiating the built-in self-test, generating test patterns with the programmable logic blocks and analyzing the resulting response with the programmable logic blocks in order to produce a pass/fail indication. Advantageously, the present method is applicable to any in-circuit reprogrammable FPGA, such as SRAM-based FPGAs. It is also applicable to all levels of testing including wafer, package, board and system. Further, all tests are performed at normal operating frequencies, thus providing at-speed testing to detect any delay faults while significantly reducing the diagnostic test times over those possible with prior art approaches.

More specifically describing the invention, the configuring step includes establishing a first group of programmable logic blocks in an FPGA as test pattern generators and output response analyzers. The configuring step also includes the step of establishing a second group of programmable logic blocks in the same FPGA as blocks under test. By repeatedly reconfiguring each block under test, each block under test is completely tested in all possible modes of operation. Pseudoexhaustive testing is used to provide maximum fault coverage totally independent of the intended system function of the FPGAs.

This is followed by the step of reversing the programming of the first and second groups of programmable logic blocks so that the first group is established as blocks under test and the second group is established as test pattern generators and output response analyzers. Then follows the step of repeatedly reconfiguring each block under test in the first group of FPGAs in order to test each such block completely in all possible modes of operation. Since every programmable logic block is individually tested, the present diagnostic testing method advantageously provides in-system location of defective devices. Such diagnostic resolution is not always possible with state of the art test systems. This, of course, functions to reduce repair time as well as repair costs by enabling one to repair or replace only those components that are actually defective.

Still other objects of the present invention will become apparent to those skilled in this art from the following description wherein there is shown and described a preferred embodiment of this invention, simply by way of illustration of one of the modes best suited to carry out the invention. As it will be realized, the invention is capable of other different embodiments and its several details are capable of modification in various, obvious aspects all without departing from the invention. Accordingly, the drawings and descriptions will be regarded as illustrative in nature and not as restrictive.

BRIEF DESCRIPTION OF THE DRAWINGS

The accompanying drawing incorporated in and forming a part of the specification, illustrates several aspects of the present invention and together with the description serves to explain the principles of the invention. In the drawing:

FIG. 1 is a schematical block diagram showing the structure of a typical programmable logic block of a field programmable gate array (FPGA); and FIG. 2 is a schematical block diagram illustrating a FPGA structure temporarily programmed for diagnostic testing in accordance with the method of the present invention.

Reference will now be made in detail to the present preferred embodiment of the invention, an example of which is illustrated in the accompanying drawing.

DETAILED DESCRIPTION OF THE INVENTION

The method of the present invention for diagnostic testing of FPGAs will now be described in detail. The method may be described as a sequence of test phases each phase consisting of a series of simple steps. The first of these steps is the configuring of the programmable logic blocks of an FPGA for completing a built-in self-test (BIST). Next is the initiating of the BIST. This step is then followed by generating test patterns with the programmable logic blocks. Next is the analyzing of the resulting response to produce a pass/fail indication. This analyzing step is also completed with the programmable logic blocks of the FPGA being tested. Lastly, the method may include the step of reading the test results.

As should be appreciated, the configuring, initiating and reading steps are all performed by a test controller such as automatic test equipment (ATE), a central processing unit (CPU) or a maintenance processor. Typically an ATE of a type known in the art is utilized for wafer/package testing. Typically a CPU or maintenance processor of a type also known in the art is utilized for board/system testing. More specifically, the test controller interacts with the FPGAs to be tested to configure the FPGA logic. This is done by retrieving a BIST configuration from the configuration storage of the test controller and loading it into the FPGAs.

In accordance with the configuring scheme, the method includes the steps of establishing a first group of programmable logic blocks as test pattern generators and output response analyzers. Further, the method includes the step of establishing a second group of programmable logic blocks as blocks under test. Once the programmable logic blocks are fully configured in the two groups, the test controller initiates the BIST. The test strategy relies upon pseudoexhaustive testing. Accordingly, every subcircuit of the FPGA is tested with exhaustive patterns. This results in maximal fault coverage without the explicit fault model assumptions and fault simulations that must necessarily be developed with prior art testing approaches. Of course, many FPGAs contain RAM modules for which exhaustive testing is impractical. For these modules, the test controller utilizes standardized state of the art RAM test sequences which are known to be exhaustive for the fault models specific to RAMs.

Reference is now made to FIG. 1 showing a programmable logic block, generally designated by reference numeral 10. The programmable logic block 10 comprises a memory block 12, a flip-flop block 14 and a combinational output logic block 16. Such a structure is, for example, featured in the AT&T ORCA programmable function unit, in the Xilinx XC4000 configurable logic block and the in ALTERA FLEX 8000 logic element. The memory block 12 may be configured as RAMs or combination look-up tables (LUTs). The flip flops in the flip flop block 14 may also be configured as latches although other programming options with synchronous and asynchronous Set and Reset, Clock Enable, etc. could be provided. Usually, the output block or cell 16 contains multiplexers (MUX) to connect different signal lines to the output of the programmable logic block 10. Usually this cell has no feed back loops and the flip flops can be directly accessed by by-passing the LUT (as shown by the dashed line in drawing FIG. 1). Advantageously, the inputs and outputs of every subcircuit in this type of simple structure are easy to control and observe. This simplifies the pseudoexhaustive testing of the cell.

Advantageously, the present testing method is particularly adapted to perform output response analysis by means of direct comparison. Such an approach is difficult to utilize in most prior art BIST applications because of the expense involved in storing the reference response or in generating it from a copy of the circuit under test. In accordance with the present method, however, the circuits under test are identical programmable logic blocks 10 and all that is needed is to create the output response analyzers to compare their outputs.

Unlike signature-based compression circuits used in most other BIST applications, comparator-based output response analyzers do not suffer from the aliasing problem that occurs when some faulty circuits produce the good circuit signature. Essentially, as long as the programmable logic blocks under test 20 being compared by the same output response analyzer do not fail in the same way at the same time, no aliasing is encountered with the comparison-based approach of the present invention. While it should be appreciated that if the blocks under test 20 are fed by the same faulty test pattern generator the applied test will be incomplete and a faulty programmable logic block under test may escape detection, this problem may be avoided by configuring the logic so that the different test pattern generators feed the blocks under test 20 being compared by the same output response analyzer. Further, all test pattern generators must be synchronized to generate the same test pattern at the same time.

Based upon the above described approach, the configuring step outlined above includes establishing a first group of programmable logic blocks 10 as exhaustive test pattern generators 18 and comparison-based output response analyzers 22. Additionally, the configuring step includes establishing a second group of programmable logic blocks 10 as blocks under test (BUTs) 20. Further, the method includes the steps of repeatedly reconfiguring each BUT 20 in order to test each BUT in all modes of operation. Accordingly, a test session may be defined as a sequence of test phases or configurations that completely tests the BUTs 20. Once the BUTs 20 have been exhaustively tested the roles of the programmable logic blocks 10 are changed, that is: the programming of the first and second groups of programmable logic blocks 10 is reversed so that the first group is established as BUTs 20 and the second group is established as test pattern generators 18 and output response analyzers 22. It should therefore be appreciated that at least two test sessions are required to test all of the programmable logic blocks 10. Advantageously, it should be noted that all the BUTs 20 are tested in parallel with this approach. Accordingly, the BIST run time is not dependent on the size of the FPGA.

Of course, an important goal of the testing strategy is to minimize the number of test sessions and thereby minimize the testing time and effectively reduce testing cost. An FPGA configured for a test session is illustrated in FIG. 2. The test pattern generators 18 work as binary counters in order to supply exhaustive test patterns to the m-input BUTs 20 in most of the test configurations. Since the programmable logic block 10 has more inputs than outputs, several programmable logic blocks are required to construct a single m-bit counter. Of course, when the memory block 12 is configured as RAM, the test pattern generators 18 work as p-bit state machines (wherein p>m) in order to generate standard RAM test sequences.

As noted above, different test pattern generators 18 must be used to feed the BUTs 20. Thus the number of test pattern generators 18 required for the BIST is equal to C where C represents the number of programmable logic block outputs that may be compressed by a single response analyzer 22. Each output response analyzer 22 comprises a look up table 24 for comparing the corresponding output from the C BUTs and a flip flop 26 to record the first mismatch. As shown in FIG. 2 the feedback from the flip flop 26 is output to an input of the look up table 24. Thus, a mismatch disables further comparisons by the output response analyzer 22 once the first error is recorded.

As also illustrated in FIG. 2, several output response analyzers 22 may be implemented in the same programmable logic block 10 depending upon the number of independent look up tables 24 in the programmable logic block. The look up tables 24 are considered to be independent if their set of inputs are disjoint in at least one programmable logic block configuration. Each one of the C test pattern generators 18 drives a group of n BUTs. Each BUT has m-inputs and O-outputs. The C×n×O outputs from the BUTs are compared by O groups of n output response analyzers 22 with each output response analyzer monitoring C outputs and the ith group of output response analyzers receiving the ith output from n BUTs.

For example in the ORCA programmable logic block there are two independent look up tables with each of those look up tables having 5 inputs. Of course, the feedback connection from the flip flop occupies one of these inputs and, accordingly, C must be set to be equal to 4. Since each programmable logic block has m=18 inputs, the number of flip flops required for a test pattern generator to generate exhaustive test patterns is also 18. Since there are f=4 flip flops in the programmable logic block, five programmable logic blocks are required for an exhaustive test pattern generator. In contrast only four programmable logic blocks would be required for the test pattern generator used for RAM mode testing. Further, it should be appreciated that there are O=5 outputs from each programmable logic block that must be compared by the output response analyzers 22. This data is summarized in the following table and compared to the XILINX 4000 and ALTERA FLEX 8000 Series FPGAs. Using this approach, most commercially available FPGAs have been found to be completely tested in two test sessions. It should be appreciated, however, that some of the smaller FPGAs require three test sessions.

TABLE 1

FPGA Architectural Parameters

| Parameter | Resource | ORCA | XILINX 4000 | ALTERA 8000 |
| --- | --- | --- | --- | --- |
| C | Comparisons/LUT | 4 | 3 | 4 |
| O | Outputs/PLB | 5 | 5 | 3 |
| L | LUTs/PLB | 2 | 2 | 1 |
| m | FFs/TPG = Inputs/PLB | 18 | 12 | 10 |
| f | FFs/PLB | 4 | 2 | 1 |

The following examples are presented to further illustrate the present invention:

EXAMPLE 1

FPGAs were programmed for the normal functions intended for the FPGAs during system operation. Programming of the FPGAs was accomplished by downloading the configuration databits (which configured the FPGAs for the intended system functions) from hard disk storage media under the direction of a microprocessor of a central processing unit. System diagnostics were then run to test the system for faults. Using the same mechanism as that used to download the intended system functions into the FPGAs, each BIST configuration was downloaded into the FPGAs in turn. Since the BIST configurations are generic, the same configuration is loaded into all FPGAs regardless of the intended system function.

Once configured, the operation of the BIST functions programmed by the FPGAs was initiated into the same controlling function as that which controlled the downloading and, upon completion of the BIST sequence, the results of the BIST was retrieved from the FPGAs by the controller for determination of the fault free/faulty or pass/fail status of each FPGA under the given BIST sequence. The next BIST configuration was then downloaded, initiated and results were retrieved. The process was continued until all BIST configurations were downloaded and executed.

Any failing BIST sequence produced by a given FPGA indicated the existence of one or more faults in that FPGA. At that point in time, any printed circuit board containing a faulty FPGA was replaced and repaired or, if sufficient diagnostic information was obtained from the BIST sequence to facilitate the identification and location of the fault in the FPGA, the intended system function for that FPGA was remapped onto the FPGA so that the faulty circuitry was not used in the system function. Following testing and necessary repair, the intended system functions were reloaded into the FPGAs. This was done via the downloading mechanism and the system was brought back into service.

EXAMPLE 2

A similar approach to that disclosed in Example 1 was used to simulate FPGA manufacturing tests where the device level test machine controlled the downloading of the BIST sequence, initiated the BIST sequence and then retrieved the BIST results. In our research laboratory, we utilized a PC running commercial FPGA vendor software for converting a digital design defined by the designer to the configuration bits needed to program the FPGA for the intended system function (we used a traffic light controller as an example system function). The configuration data was downloaded via a standard PC port and cable to a printed circuit board containing a FPGA (AT&T optimized reconfigurable cell array—ORCA—2C Series). We designated the BIST configurations in the same manner as a system function with the exception being that the intended function in this case was a self-test of the FPGA circuitry. Once the BIST configuration data had been obtained via the FPGA vendor software (we used the AT&T ORCA development system—ODS), the BIST configurations were downloaded into the FPGA in order to test the FPGA on the printed circuit board.

EXAMPLE 3

In this example, the configurations needed for a complete BIST session are described and results regarding fault coverage, test-time and memory requirements are presented.

While pseudoexhaustive testing does not require fault simulation, we used the fault simulator to evaluate the fault coverage contained in the different phases of the BIST session in accordance with the method of the present invention. First we developed a complete gate-level model for the ORCA programmable logic block, including the programmable logic block configuration BIST which was represented as a primary input whose values were "frozen" during each phase. This allowed us to also simulate the stuck-at-faults effecting the configuration BISTS. The exhaustive testing of each of the three modules (look up tables, flip flops and output multiplexor) were used to determine undetectable faults (3 faults in the look up tables and 4 faults in the flip flops) which were removed from the fault list. A total of 2224 collapsed stuck-at-gate-level faults were left in the programmable logic block, consisting of 1538 faults in the look up tables, 440 faults in the flip flops and 246 faults in the output multiplexor.

A total of 9 configurations were developed to completely test each programmable logic block. These 9 phases which comprised a complete programmable logic block BIST session are described in more detail below. The fault simulation results are summarized in Table 2 in terms of the number of new faults detected in each phase for each of the 3 modules, a cumulative number of total faults detected and the obtained fault coverage.

TABLE 2

PLB Fault Simulation Results

| Phase No. | Number of Faults Detected | | | Total | Fault Coverage |
|---|---|---|---|---|---|
| | LUTs | FFs | MUX | | |
| 1 | 1457 | 0 | 54 | 1511 | 67.9% |
| 2 | 60 | 0 | 30 | 1601 | 72.0% |
| 3 | 16 | 0 | 28 | 1645 | 74.0% |
| 4 | 5 | 0 | 25 | 1675 | 75.3% |
| 5 | 0 | 234 | 25 | 1934 | 87.0% |
| 6 | 0 | 72 | 33 | 2039 | 91.7% |
| 7 | 0 | 60 | 30 | 2129 | 95.7% |
| 8 | 0 | 40 | 15 | 2184 | 98.2% |
| 9 | 0 | 34 | 6 | 2224 | 100% |

As should be appreciated from reviewing Table 2, the first 4 phases provided a complete test for the look up tables while the following 5 phases detected all the faults in the flip flops. Of course, all 9 phases were required to detect all the faults in the output multiplexor. The 9 configurations may be described in terms of the modes set for each of the three modules. An ORCA output uses a 9-to-1 multiplexor to select any one of the 4 look up table outputs or 4 flip-flop outputs as well as the carry out from the look up tables in the fast adder mode of operation (a mode of operation with dedicated look-ahead-carry circuitry available in the more recent FPGA look up table architectures). This 9-to-1 multiplexor establishes the number of configurations (9) needed to completely test the output multiplexor block.

There were 4 distinct modes of operation for the ORCA look up tables. These were RAM, fast adder, look up table-based logic functions of 5 variables and look up table-based logic functions of 4 variables. These 4 modes of operation were tested during the first 4 phases of the programmable logic block BIST as summarized in Table 3.

TABLE 3

PLB BIST Configurations

FF/Latch Modes and Options

| Phase No. | FF/ Latch | Set/ Reset | Clock | Clock Enable | FF Data Select | LUT Mode | PLB Pins |
|---|---|---|---|---|---|---|---|
| 1 | — | — | — | — | — | RAM | 13 |
| 2 | — | — | — | — | — | Fast Adder | 14 |
| 3 | — | — | — | — | — | 5-Var. | 14 |
| 4 | — | — | — | — | — | 4-Var. | 14 |
| 5 | FF | Async Set | Fall Edge | Active Low | LUT Output | 4-Var. | 13 |
| 6 | FF | Async Reset | Rise Edge | Active High | PLB Input | 4-Var. | 13 |
| 7 | Latch | Sync Set | Active Low | Active Low | LUT Output | 4-Var. | 13 |
| 8 | Latch | Sync Reset | Active High | Active High | PLB Input | 4-Var. | 13 |
| 9 | FF | — | Rise Edge | Active Low | Dyn. Select | 4-Var. | 13 |

During the RAM mode configuration the test pattern generators were configured to generate a standard RAM test sequence while the test pattern generators for all the other phases were configured as binary counters. Once the look up tables had been tested in the RAM mode, the remaining BIST phases relied on chessboard patterns stored in the look up tables to insure all possible patterns at the look up table outputs.

The flip flop module had a number of optional modes of operation, including: (1) choice of flip flop or latch, (2) choice of active clock edge (or level for latches), (3) optional clock enable with choice of active level, (4) choice of preset or clear, (5) synchronous or asynchronous preset/clear activation with choice of active level and (6) selection of data from the look up table output or directly from the programmable logic block inputs. The number of possible combinations of these options was too large to be considered. However, we determined from fault simulating the gate-level programmable logic block model that five configurations are sufficient to completely test the flip flop module. These are the last 5 phases summarized in Table 3.

It was also found that the ORCA could be put through pseudoexhaustive testing in only two test sessions. A total of 18 configurations was all that was required to completely test all the programmable logic blocks. These 18 configurations compare favorably with the 32 configurations currently used for a state of the art ORCA manufacturing test.

Unlike the BIST run-time, the configuration memory requirements and the configuration download time depended on the size of the FPGA. For the largest 1 C Series ORCA (the AT&T 1C09), approximately 16 Kbytes of storage were needed per configuration. This means about 160 Kbytes for the 9 BIST configurations and the "normal" configuration needed to be restored after board or system test. Download time for the ORCA 1 C Series FPGAs varies from 2–35 msec per configuration depending upon the type of interface between the configuration storage media and the FPGA. The execution time for the BIST sequence is approximately 15 msec at a 10 MHz clock rate. This results in approximately 1 second of testing time required to completely test all the programmable logic blocks. Of course, if these requirements are too restrictive for system level testing, the test time could be reduced by removing some configurations which detect very few new faults or which represent modes of operation not used in the system for which the FPGA being tested is applied.

During testing it was found that in some instances, the routing resources of the FPGA were not sufficient to allow the routing of all test pattern generator outputs to BUTs and all BUT outputs to output response analyzers. This problem was relatively easily overcame, however, by allowing a small deviation from the principal of pseudoexhaustive testing. That is, for every configuration, instead of applying exhaustive patterns to all the inputs and observing all the outputs of a BUT, exhaustive patterns were only applied to those inputs and observed only from those outputs that were actually used in that phase.

Further, it should be noted that the output response analyzer results must be brought out of the FPGA for determining the faulty fault-free status of the FPGA. The boundary scan (BS) circuitry in the I/O buffers offers the best approach for this task. In some FPGAS, however, when all output response analyzer outputs are routed to the BS chain, the routing resources in the perimeter of the FPGA become exhausted. It was found, however, that by ORing the output results from the output response analyzers into fewer bits, the BIST configurations may be successfully routed in the FPGA even though additional logic resources are required for the OR logic. One disadvantage of this approach was that some fault diagnostic capability with respect to identifying a particular faulty programmable logic block was lost. The advantage, however, was that the programmable logic blocks implementing the OR logic could be placed near the output response analyzers from which they receive input signals. This advantageously reduced the routing congestion near the perimeter of the array where many output response analyzer outputs would otherwise be for routing resources in order to reach the BS chain.

In summary, numerous benefits result from employing the concepts of the present invention. As should be appreciated, and noted from the above description, the present method takes advantage of the reprogrammability of the FPGAs, reconfiguring the FPGAs to test themselves only during off-line testing. As a result, there is no need to provide testability hardware in the design of the FPGA. Accordingly, all logic resources in the FPGA are available for system functionality.

In addition, hardware design and diagnostic software development intervals may be reduced since the FPGA BIST approach is generic and is applicable to all the SRAM based FPGAs in the system. Since the test sequences are generic and they are the function of the FPGA architecture and not a function of what is programmed into the FPGA, this technique may also be used for manufacturing test from wafer level through package and board level to unit and system level testing. Advantageously, lower-cost automatic test equipment may be utilized for purposes of device and package level testing. Further, it should be appreciated that the BIST configurations developed also test the portion of the programming interface of the FPGA that is associated with the programmable logic blocks. The exception is the programming read-back circuitry that may be tested by simply reading back each configuration after it has been programmed. Advantageously, the BIST configurations also tests a large portion of the programmable interconnection network.

The foregoing description of a preferred embodiment of the invention has been presented for purposes of illustration and description. It is not intended to be exhaustive or to limit the invention to the precise form disclosed. Obvious modifications or variations are possible in light of the above teachings. For example, the FPGA under test could be configured to act as an interactive logic array whereby blocks under test are connected to other blocks under test in a series arrangement leading to an output response analyzer. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

We claim:

1. A method of testing a field programmable gate array including a plurality of programmable logic blocks, comprising the steps of:

configuring said programmable logic blocks for completing a built-in self-test;

initiating said built-in self-test;

generating identical test patterns with said programmable logic blocks;

applying said test patterns to equivalently configured programmable logic blocks; and comparing outputs of said equivalently configured programmable logic blocks in order to produce a pass/fail indication for each of said equivalently configured programmable logic blocks under test.

2. The method set forth in claim 1, wherein said configuring includes establishing a first group of said programmable logic blocks as test pattern generators and output response analyzers.

3. The method set forth in claim 2, wherein said configuring further includes establishing a second group of said programmable logic blocks as blocks under test.

4. The method set forth in claim 3, including repeatedly reconfiguring each block under test in order to test each block under test completely in all possible modes of operation.

5. The method set forth in claim 4, including reversing programming of said first and second groups of said programmable logic blocks so that said first group is established as blocks under test and said second group is established as test pattern generators and output response analyzers.

6. The method set forth in claim 5, including repeatedly reconfiguring each block under test in order to test each block under test completely in all possible modes of operation following reversing programming of said first and second group of programmable logic blocks.

7. The method set forth in claim 1, further including reading results of said built-in self-test.

8. The method set forth in claim 6, further including reading results of said built-in self-test.

9. The method set forth in claim 1, wherein said test patterns being generated are exhaustive.

10. A method of testing a field programmable gate array including a plurality of programmable logic blocks, comprising the steps of:

configuring said programmable logic blocks for completing a built-in self-test as two equivalently configured programmable logic blocks under test;

initiating said built-in self-test;

generating identical test patterns with said programmable logic blocks;

applying said test patterns to said equivalently configured programmable logic blocks under test;

comparing outputs of said programmable logic blocks under test; and generating a test result indication for said equivalently configured programmable logic blocks under test.

11. The method of testing a field programmable gate array set forth in claim 10, wherein said configuring step further includes establishing a first group of said programmable logic blocks as a test pattern generator and an output response analyzer and a second group of said programmable logic blocks as said blocks under test.

12. The method of testing a field programmable gate array set forth in claim 11, including repeatedly reconfiguring each block under test in order to test each block under test completely in all possible modes of operation.

13. The method of testing a field programmable gate array set forth in claim 11, including reversing programming of said first and second groups of said programmable logic blocks so that said first group is established as blocks under test and said second group is established as a test pattern generator and an output response analyzer.

14. The method of testing a field programmable gate array set forth in claim 13, including repeatedly reconfiguring each block under test in order to test each block under test completely in all possible modes of operation following reversing programming of said first and second groups of programmable logic blocks.

15. The method of testing a field programmable gate array set forth in claim 10, wherein said test patterns being generated are exhaustive.

* * * * *